(12) United States Patent
Park et al.

(10) Patent No.: US 9,324,921 B2
(45) Date of Patent: Apr. 26, 2016

(54) LIGHT-EMITTING DIODE PACKAGE

(71) Applicant: Seoul Viosys Co., Ltd., Ansan-si (KR)

(72) Inventors: Jun Yong Park, Ansan-si (KR);
Daewoong Suh, Ansan-si (KR); Bo Ram I Jang, Ansan-si (KR); Hee Cheul Jung, Ansan-si (KR); Kyu Ho Lee, Ansan-si (KR); Chang Hoon Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/350,323

(22) PCT Filed: Oct. 8, 2012

(86) PCT No.: PCT/KR2012/008116
§ 371 (c)(1),
(2) Date: Apr. 24, 2015

(87) PCT Pub. No.: WO2013/051906
PCT Pub. Date: Apr. 11, 2013

(65) Prior Publication Data
US 2015/0295139 A1 Oct. 15, 2015

(30) Foreign Application Priority Data
Oct. 7, 2011 (KR) .................... 10-2011-0102689

(51) Int. Cl.
*H01L 33/00* (2010.01)
*H01L 33/48* (2010.01)
*H01L 33/56* (2010.01)
(Continued)

(52) U.S. Cl.
CPC .............. *H01L 33/483* (2013.01); *H01L 33/22* (2013.01); *H01L 33/44* (2013.01); *H01L 33/486* (2013.01); *H01L 33/52* (2013.01); *H01L 33/54* (2013.01);
(Continued)

(58) Field of Classification Search
CPC ....... H01L 33/52; H01L 33/486; H01L 33/54; H01L 33/56
See application file for complete search history.

(56) References Cited

U.S. PATENT DOCUMENTS 8,212,275 B2   7/2012  Yamada
2006/0220036 A1  10/2006  Lee et al.
(Continued)

FOREIGN PATENT DOCUMENTS

EP    2065931       6/2009
JP    2005-327820   11/2005
(Continued)

OTHER PUBLICATIONS

Supplementary European Search Report issued on Apr. 24, 2015, in European Patent Application No. 12837773.6.
(Continued)

*Primary Examiner* — Ngan Ngo
(74) *Attorney, Agent, or Firm* — H.C. Park & Associates, PLC

(57) ABSTRACT

The present invention relates to a light-emitting diode package. According to the present invention, a light-emitting diode package comprises: a substrate for growth; a passivation layer formed on a surface of one side of the substrate for growth; and a package substrate having a main body portion and a wall portion, wherein the wall portion is formed on the main body portion. At least the space formed among the main body portion, the wall portion and the passivation layer is sealed from the outside.

20 Claims, 4 Drawing Sheets

(51) Int. Cl.
*H01L 33/54* (2010.01)
*H01L 33/52* (2010.01)
*H01L 33/44* (2010.01)
*H01L 33/62* (2010.01)
*H01L 33/22* (2010.01)

(52) U.S. Cl.
CPC ............... *H01L 33/56* (2013.01); *H01L 33/62* (2013.01); *H01L 2924/0002* (2013.01)

(56) References Cited

U.S. PATENT DOCUMENTS

| | | |
|---|---|---|
| 2007/0090378 A1 | 4/2007 | Lee et al. |
| 2009/0023234 A1* | 1/2009 | Hsu et al. ................. 438/27 |
| 2009/0050926 A1 | 2/2009 | Suehiro et al. |
| 2009/0121249 A1 | 5/2009 | Tseng et al. |
| 2009/0173956 A1 | 7/2009 | Aldaz et al. |
| 2010/0019260 A1 | 1/2010 | Epler et al. |
| 2010/0051995 A1 | 3/2010 | Katsuno et al. |
| 2011/0291143 A1* | 12/2011 | Kim et al. ................. 257/98 |
| 2012/0138962 A1* | 6/2012 | Tsang ....................... 257/81 |
| 2012/0223351 A1* | 9/2012 | Margalit .................... 257/98 |
| 2013/0334557 A1* | 12/2013 | Uchida et al. .............. 257/98 |

FOREIGN PATENT DOCUMENTS

| | | |
|---|---|---|
| JP | 2009-200522 | 9/2009 |
| JP | 2009-252779 | 10/2009 |
| JP | 2011-171376 | 9/2011 |
| KR | 10-0708936 | 4/2007 |
| KR | 10-2010-0099286 | 9/2010 |
| KR | 10-2011-0031999 | 3/2011 |

OTHER PUBLICATIONS

International Search Report dated on Feb. 14, 2013 in International Patent Application No. PCT/KR2012/008116.

* cited by examiner

LIGHT-EMITTING DIODE PACKAGE

CROSS REFERENCE TO RELATED APPLICATIONS

This application is the National Stage Entry of International Application PCT/KR2012/008116, filed on Oct. 8, 2012, and claims priority from and the benefit of Korean Patent Application No. 10-2011-0102689, filed on Oct. 7, 2011, both of which are incorporated herein by reference for all purposes as if fully set forth herein.

BACKGROUND

1. Field

The present invention relates to a light emitting diode package.

2. Discussion of the Background

A light emitting diode generally refers to a diode based on a PN junction between a p-type semiconductor and an n-type semiconductor.

In the light emitting diode with the p-type semiconductor joined to the n-type semiconductor, when electric current is created between the p-type semiconductor and the n-type semiconductor by application of voltage, holes migrate from the p-type semiconductor towards the n-type semiconductor and electrons migrate from the n-type semiconductor towards the p-type semiconductor, so that the holes and the electrons migrate into the PN junction.

In the PN junction, the electrons are recombined with the holes while the energy band of the electrons is lowered from the conduction band to the valence band. At this time, energy corresponding to a height difference, that is, energy difference, between the conduction band and the valence band is generated and emitted in the form of light.

Such a light emitting diode is a semiconductor device emitting light, and has various characteristics, such as eco-friendliness, low operating voltage, long lifespan, low price, and the like. Conventionally, light emitting diodes have been used for display lamps or display of simple information such as numerals and the like, and recent development of industrial technologies, particularly, in the field of information displays and semiconductors, has led to expansion of application ranges of the light emitting diode to various fields comprising displays, vehicle head lamps, projectors, and the like.

FIG. 1 is a sectional view of a typical light emitting diode package.

Referring to FIG. 1, the typical light emitting diode package (100) may comprise a light emitting diode chip (110), a package substrate (120), walls (130), and a glass member (140).

The light emitting diode chip (110) may be a flip chip, in which a light emitting diode device (112) comprising a growth substrate (not shown) and a light emitting diode (not shown) disposed on one surface of the growth substrate (not shown) is flip-bonded to a sub-mount (116) via bumps (114).

The light emitting diode chip (110) may be mounted on one surface of the package substrate (120). The package substrate (120) may comprise electrode pads (122) which extend from one surface of the package substrate (120) to the other surface thereof through the package substrate (120). Here, the light emitting diode chip (110) may be connected to the electrode pads (122) via wires (118).

In the light emitting diode package (100), the walls (130) are arranged along an edge of the package substrate (120) and the glass member (140) is bonded to the walls (130) by a bonding agent (150) to seal the light emitting diode chip (110).

As a result, such a typical light emitting diode package (100), particularly, a package of a flip-chip type light emitting diode chip, has a complicated structure, thereby providing problems of high manufacturing cost and a complicated process.

SUMMARY

It is an aspect of the present invention to provide a light emitting diode package which is formed by packaging a flip-chip type light emitting diode at the chip level to have a simple structure.

It is another aspect of the present invention to provide a light emitting diode package having improved light extraction efficiency.

In accordance with one aspect of the present invention, a light emitting diode package comprises: a growth substrate; a passivation layer formed on one surface of the growth substrate; and a package substrate comprising a body section and a wall section disposed on the body section, wherein at least a space between the body section, the wall section and the passivation layer is sealed from outside.

The light emitting diode package may further comprise a semiconductor structure layer arranged between the growth substrate and the passivation layer and comprising a first type semiconductor layer, an active layer and a second type semiconductor layer, wherein the passivation layer may comprise openings through which the first type semiconductor layer and the second type semiconductor layer are partially exposed.

The light emitting diode package may further comprise a first bump and a second bump disposed on the passivation layer and electrically connected to the first type semiconductor layer and the second type semiconductor layer through the openings of the passivation layer, respectively.

The first bump and the second bump may be disposed in a predetermined area of the body section and may be brought into contact with a first electrode pad and a second electrode pad passing through the body section, respectively.

Contact between the bumps and the electrode pads may be achieved via a conductive material.

The passivation layer may cover one surface and a lateral side of the semiconductor structure layer, or covers the one surface of the semiconductor structure layer without covering the lateral side thereof.

The active layer may be disposed such that the wall section of the package substrate is disposed in a lateral direction thereof.

The passivation layer may be connected to the wall section by a sealing member.

The sealing member may be a conductive material.

The light emitting diode package may further comprise a sealing pad between the passivation layer and the sealing member or between the sealing member and the wall section.

The growth substrate may comprise protrusions and depressions formed on the other side thereof.

The body section of the package substrate may be integrally formed with the wall section thereof.

The body section and the wall section of the package substrate may be formed of different materials.

The present invention provides a light emitting diode package which is formed by packaging a flip-chip type light emitting diode at the chip level to have a simple structure.

In addition, the present invention provides a light emitting diode package having improved light extraction efficiency.

DETAILED DESCRIPTION OF THE ILLUSTRATED EMBODIMENTS

Hereinafter, exemplary embodiments of the present invention will be described in detail with reference to the accompanying drawings.

Figure 1:
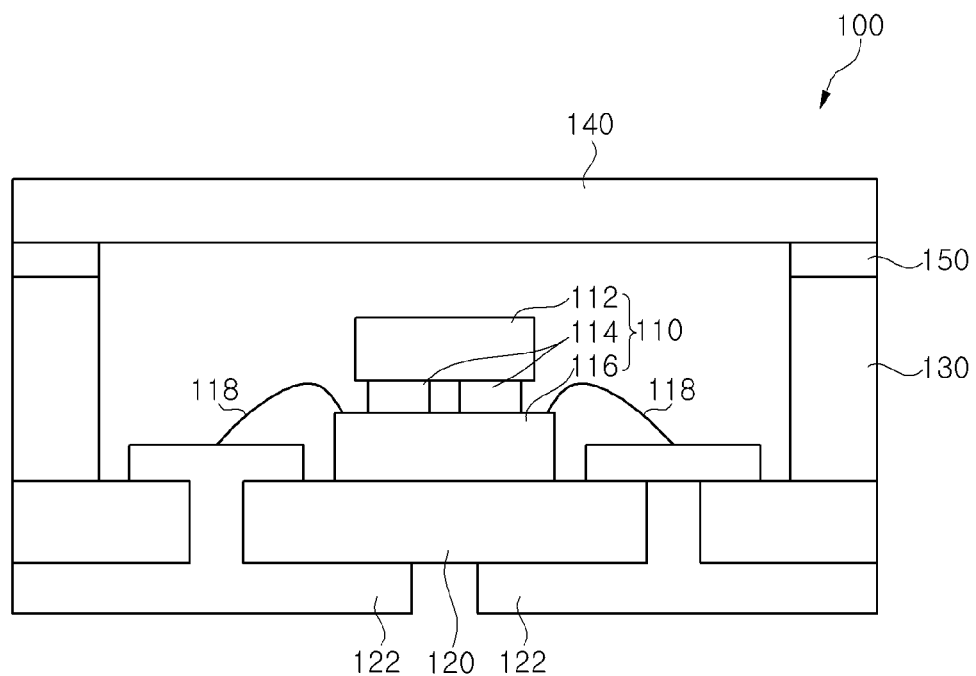
FIG. 1 is a sectional view of a typical light emitting diode package.
Figure 2:
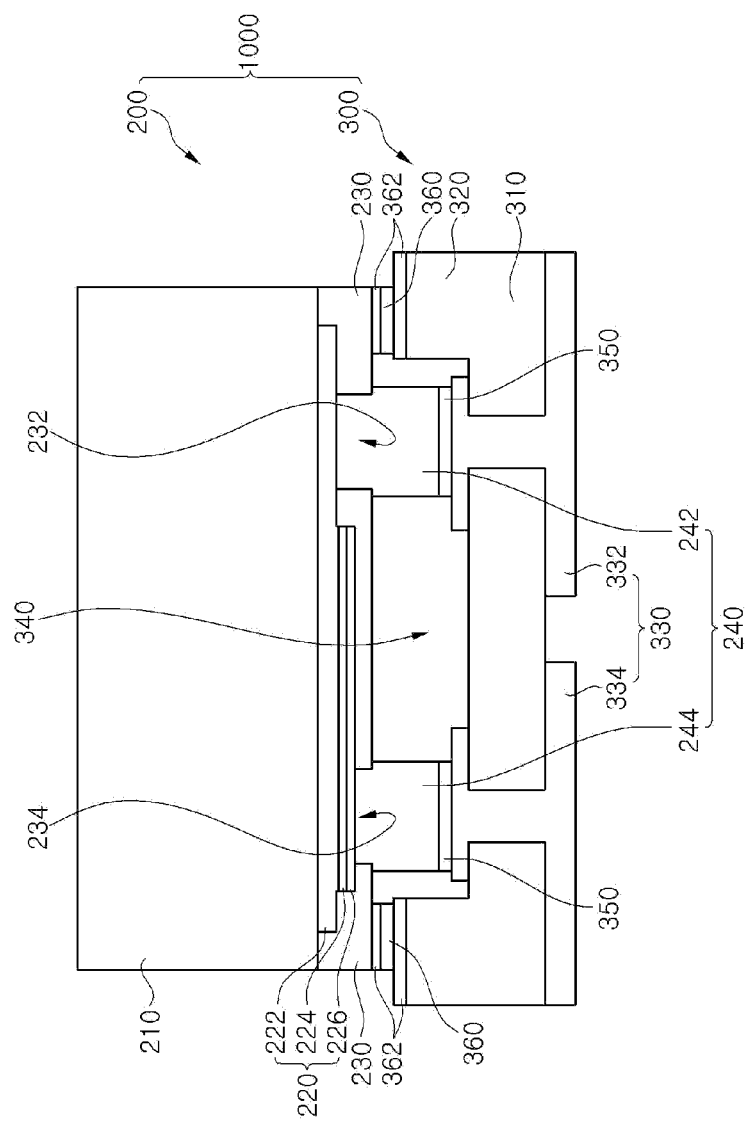
FIG. 2 is a sectional view of a light emitting diode package according to one embodiment of the present invention.

FIG. 2 is a sectional view of a light emitting diode package according to one embodiment of the present invention.

Referring to FIG. 2, a light emitting diode package (1000) according to one embodiment comprises a light emitting diode chip (200) and a package substrate (300) corresponding to the light emitting diode chip (200).

The light emitting diode chip (200) may comprise a growth substrate (210), a semiconductor structure layer (220), a passivation layer (230), and bumps (240).

The package substrate (300) may comprise a body section (310) and a wall section (320).

The body section (310) may comprise electrode pads (330).

The growth substrate (210) may be any substrate, for example, a sapphire substrate, a silicon carbide substrate, or a silicon substrate, which allows the semiconductor structure layer (220) described below to be formed thereon. Preferably, the growth substrate (210) may be a sapphire substrate.

The growth substrate (210) may have a thickness of 120 μm or more, preferably from 120 μm to 300 μm. Here, the growth substrate 210 may have a ratio of longitudinal or transverse length to thickness of 0.26 or more. For example, when the growth substrate (210) has a square shape, each side of which has a length of 1000 μm, the growth substrate (210) may have a thickness of 260 μm or more. This structure can secure light extraction efficiency, which is increased with increasing thickness of the growth substrate (210).

The growth substrate (210) has the semiconductor structure layer (220) disposed on one surface thereof, and may be formed on the other surface thereof with a patterned sapphire substrate (PSS) pattern (not shown).

The PSS pattern (not shown) serves to reduce light loss due to total reflection of light inside the growth substrate (210) when the light generated in the semiconductor structure layer (220) is emitted through the other surface of the growth substrate (210). Namely, when light passes through two media having different indexes of refraction, that is, when light is emitted to the outside (that is, air) through the growth substrate (210), reflection and transmittance of light occur at an interface therebetween (that is, at an interface between the growth substrate (210) and the outside). The PSS pattern (not shown) serves to minimize reflection of light at the interface and increase intensity of light emitted to the outside through the growth substrate (210), thereby improving luminous efficacy.

The PSS pattern (not shown) may be composed of semispherical protrusions formed on the other surface of the growth substrate (210), without being limited thereto. That is, the PSS pattern may be composed of protrusions and depressions having various shapes, for example, a conical shape, a faceted conical shape comprising a pyramid shape, and the like.

The semiconductor structure layer (220) may comprise a first type semiconductor layer (222), an active layer (224) and a second type semiconductor layer (226). In addition, the semiconductor structure layer (220) may further comprise a buffer layer (not shown), a super-lattice layer (not shown), or an electron blocking layer (not shown). At this time, the semiconductor structure layer (220) can omit other layers excluding the active layer (224). Further, in the semiconductor structure layer (220), at least parts of the second type semiconductor layer (226) and the active layer (224) are subjected to mesa etching to expose part of the first type semiconductor layer (222).

The first type semiconductor layer (222) may be a III-N based compound semiconductor layer doped with a first type impurity, for example, an N-type impurity. For example, the first type semiconductor layer (222) may be an (Al, Ga, In)N-based Group III nitride semiconductor layer. The first type semiconductor layer (222) may be an N-type impurity-doped GaN layer, that is, an N—GaN layer. When the active layer (224) is formed to emit UV light, the first type semiconductor layer (222) may be an N—AlGaN layer, which is an Al-doped N—GaN layer. Further, the first type semiconductor layer (222) may consist of a single layer or multiple layers. For example, when the first type semiconductor layer (222) consists of multiple layers, the first type semiconductor layer (222) may have a super-lattice structure.

The active layer (224) may be a III-N based compound semiconductor layer, for example, an (Al, Ga, In)N semiconductor layer. The active layer (224) may comprise a single layer or multiple layers, and may emit light having at least a constant wavelength. Further, the active layer (224) may have a single quantum well structure comprising a single well layer (not shown), or a multi-quantum well structure in which well layers (not shown) and barrier layers (not shown) are alternately stacked one above another. In this case, either the well layer (not shown) or the barrier layer (not shown), or both may have a super-lattice structure. When emitting UV light, the active layer (224) may be formed of an Al-containing nitride semiconductor layer, for example, InAlGaN.

The second type semiconductor layer (226) may be a III-N based compound semiconductor layer doped with a second type impurity, for example, a P-type impurity. For example, the second type semiconductor layer (226) may be an (Al, Ga, In)N-based Group III nitride semiconductor layer. The second type semiconductor layer (226) may be a P-type impurity-doped GaN layer, that is, a P—GaN layer. When the active layer (224) is formed to emit UV light, the second type semiconductor layer (226) may be a P—AlGaN layer, which is an Al-doped P—GaN layer. Further, the second type semiconductor layer (226) may consist of a single layer or multiple layers. For example, the second type semiconductor layer (226) may have a super-lattice structure.

The buffer layer (not shown) may be formed to relieve lattice mismatch between the substrate (210) and the first type semiconductor layer (222). In addition, the buffer layer (not shown) may consist of a single layer or multiple layers. When the buffer layer consists of multiple layers, the buffer layer may comprise a low temperature buffer layer and a high temperature buffer layer. The buffer layer (not shown) may be formed of AlN.

The super-lattice layer (not shown) may be disposed between the first type semiconductor layer (222) and the active layer (224), and have a structure in which III-N based compound semiconductor layers, for example, (Al, Ga, In)N semiconductor layers are stacked one above another. For example, the super-lattice layer may have a structure in which InN layers and InGaN layers are alternately stacked one above another. Since the super-lattice layer (not shown) is formed before formation of the active layer (224), the super-lattice layer relieves formation of dislocations or defects in the active layer (224) by preventing movement of the dislocations or defects to the active layer (224) and improves crystallinity of the active layer (224).

The electron blocking layer (not shown) may be disposed between the active layer (224) and the second type semiconductor layer (226) to improve recombination efficiency of electrons and holes, and may be formed of a material having a relatively wide band gap. The electron blocking layer (not shown) may be formed of an (Al, In, Ga)N-based Group III nitride semiconductor, and may be an Mg doped P—AlGaN layer.

The passivation layer (230) may be formed on one surface of the growth substrate (210) comprising the semiconductor structure layer (220). At this time, the passivation layer (230) covers not only the one surface of the semiconductor structure layer (220) but also a lateral side thereof to protect the semiconductor structure layer (220) by preventing the semiconductor structure layer (220) from being exposed outside. The passivation layer 230 may be formed of an insulation layer, such as a silicon oxide layer or a silicon nitride layer. The passivation layer (230) may comprise an opening (232) through which the first type semiconductor layer (222) is partially exposed, and an opening (234) through which the second type semiconductor layer (226) is partially exposed.

The bumps (240) may comprise a first bump (242) and a second bump (244). The first bump (242) may be brought into contact with the first type semiconductor layer (222) exposed through the opening (232) of the passivation layer (230), and the second bump (244) may be brought into contact with the second type semiconductor layer (226) exposed through the opening (234) of the passivation layer (230). The bumps (240) may be protrusions having a predetermined height on the passivation layer (230).

Each of the bumps (240) may consist of a single layer or multiple layers, which may comprise Ni, Cr, Ti, Al, Ag, Au, or mixtures thereof.

The package substrate (300) may comprise the body section (310) and the wall section (320), which are arranged along an edge of the body section (310) on the body section (310). Here, the body section (310) may be integrally formed with the wall section (320). That is, the body section (310) and the wall section (320) of the package substrate (300) may be formed by forming grooves in predetermined areas of a PCB substrate or a ceramic substrate.

The package substrate (300) may comprise a trench (340) formed by the body section (310) and the wall section (320).

The electrode pads (330) comprises a first electrode pad (332) and a second electrode pad (334), and may be disposed in a predetermined area of the body section (310) of the package substrate (300). The electrode pads (330) may pass through the body section (310) in the form of extending from one side of the body section (310) to the other side thereof. The first electrode pad (332) is electrically connected to the first bump (242) and the second electrode pad (334) is electrically connected to the second bump (244).

In this case, the first bump (242) and the second bump (244) may be connected to the first electrode pad (332) and the second electrode pad (334) by a bonding member (350), respectively. The bonding member (350) may be composed of a conductive material, or a conductive adhesive such as silver pastes.

In addition, the bonding member (350) may be composed of the same material as the material (for example, Au, Al, or the like) constituting the bumps (240) or the electrode pads (330). That is, the bumps (240) may be coupled to the electrode pads (330) through phase transition of part of the bumps (240) or the electrode pads (330) by applying heat, ultrasonic waves or pressure thereto.

The light emitting diode package (1000) according to one embodiment of the invention may be packaged at the chip level, with the light emitting diode chip (200) coupled to the package substrate (300).

That is, as shown in FIG. 2, a sealing member (360) is disposed between the wall section (320) and the passivation layer (230) of the light emitting diode chip (200) to interconnect the same, whereby a space defined between the body section (310), the wall section (320) and the passivation layer (230), that is, the trench (340), is sealed from outside, while allowing the light emitting diode chip (200) and the package substrate (300) to be packaged.

In this case, the sealing member (360) may be formed of the same material as that of the bonding member (350), which is disposed between the bumps (240) and the electrode pads (330) to bond the bumps (240) to the electrode pads (330). For example, the sealing member (360) may be formed of a conductive material. Alternatively, the sealing member (360) may be an adhesive composed of a resin or the like.

On the other hand, a sealing pad (362) may be disposed between the sealing member (360) and the passivation layer (230) or between the sealing member (360) and the wall section (320). The sealing member (360) has better sealing effects when used to seal a space between the same materials than when used to seal a space between different materials such as the passivation layer (230) and the wall section (320). For this reason, the sealing pad (362) is disposed therebetween. The sealing pad (362) may be formed of the same material as that of the bumps (240) or the electrode pads (330).

Accordingly, the light emitting diode package (1000) according to this embodiment comprises the light emitting diode chip (200) and the package substrate (300), wherein the light emitting diode chip (200) may comprise the growth substrate (210), the semiconductor structure layer (220), the passivation layer (230) and the bumps (240); and the package substrate (300) may comprise the body section (310) and the wall section (320). Here, the body section (310) may comprise the electrode pads (330). The light emitting diode package (1000) may be prepared by bringing the bumps (240) of the light emitting diode chip (200) into contact with the electrode pads (330) of the package substrate (300), and sealing a space defined between the wall section (320) and the passivation layer (230) of the light emitting diode chip (200) with the sealing member (360).

In this way, the structure of the light emitting diode package (1000) according to the embodiment can be simplified by directly packaging the light emitting diode chip (200) and the package substrate (300), thereby providing a simple manufacturing process and reducing manufacturing costs.

Further, in the light emitting diode package (1000) according to the embodiment, with the bumps (240) of the light emitting diode chip (200) inserted into the trench (340) of the package substrate (300), the space between the wall section (320) and the passivation layer (230) of the light emitting diode chip (200) is sealed for packaging, thereby minimizing the size of the trench (340). In addition, since the active layer (224) of the light emitting diode chip (200) is not disposed in the trench (340) of the package substrate (300), the light emitting diode package has no other components except for the passivation layer (230) in a lateral direction of the active layer (224) so as to facilitate light extraction, thereby providing high light extraction efficiency.

Further, in the light emitting diode package (1000) according to the embodiment, the growth substrate (210) has a suitable thickness to provide high light extraction efficiency, and is provided at the other side thereof with the PSS pattern (not shown), thereby providing high light extraction efficiency.

Further, since the light emitting diode package (1000) according to the embodiment does not comprise a glass member used in the related art, light emitted from the light emitting diode does not pass through the glass member, thereby providing high light extraction efficiency.

Figure 3:
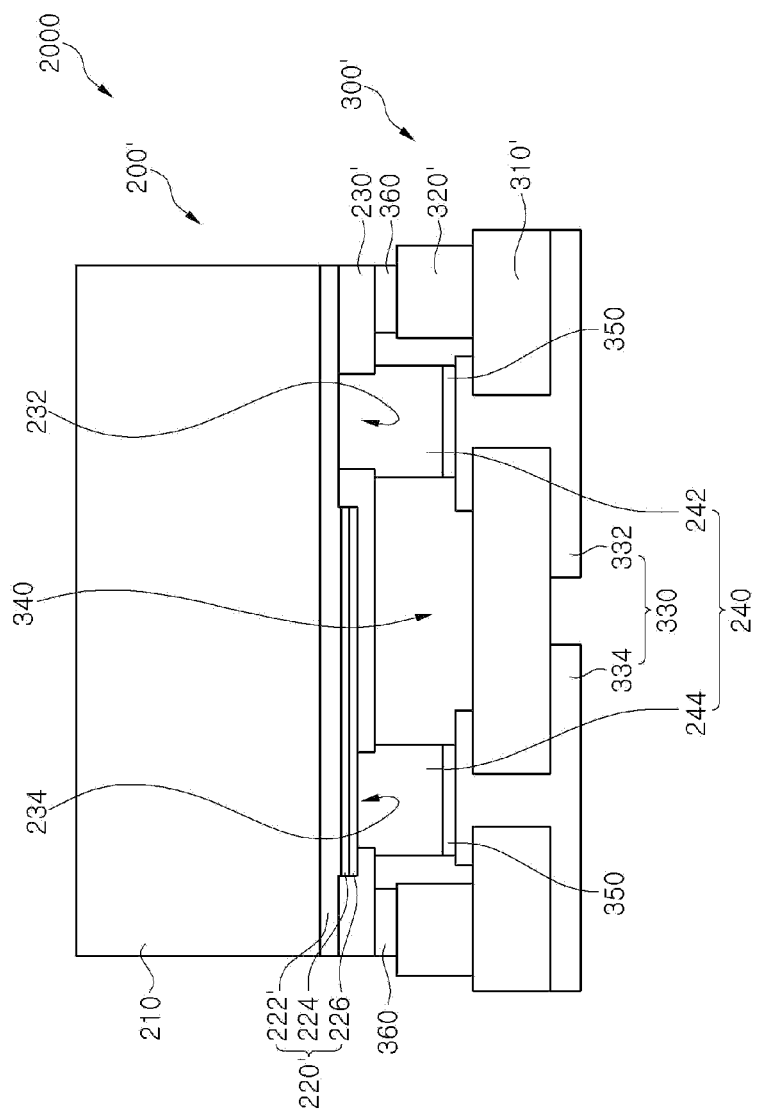
FIG. 3 is a sectional view of a light emitting diode package according to another embodiment of the present invention.

FIG. 3 is a sectional view of a light emitting diode package according to another embodiment of the present invention.

Referring to FIG. 3, a light emitting diode package (2000) according to this embodiment may comprise a light emitting diode chip (200') and a package substrate (300').

The light emitting diode chip (200') may comprise a growth substrate (210), a semiconductor structure layer (220'), a passivation layer (230'), and bumps (240).

The package substrate (300') may comprise a body section (310') and a wall section (320').

The body section (310') may comprise electrode pads (330).

Herein, since the light emitting diode package (2000) according to this embodiment is substantially the same as the light emitting diode package (1000) described with reference to FIG. 2 except for some features, the different features of the light emitting diode package (2000) will be mainly described hereinafter.

In the light emitting diode package (2000) according to this embodiment, part of the semiconductor structure layer (220'), for example, a lateral side of a buffer layer (not shown) or a first type semiconductor layer (222'), is exposed in a state of being coplanar with a lateral side of the growth substrate (210). With this structure, the passivation layer (230') may be provide so as to cover one surface of the semiconductor structure layer (220') without covering a lateral side of the semiconductor structure layer (220').

In addition, the light emitting diode package (2000) according to this embodiment may comprise a body section (310') and a wall section (320'), which are formed of different materials. That is, the wall section (320') may be formed of a different material (for example, the same material as that of the electrode pads (330) or the passivation layer (230')) than that of the body section along an edge of the body section (310') on the body section (310'). All of the sealing pads (362) can be omitted.

Although not shown, when the wall section (320') is formed of the same material as that of the electrode pads (330), the wall section (320') and the passivation layer (230') are formed of different materials. In this case, in order to improve sealing effects of the sealing member (360), a sealing pad (362) may be provided between the sealing member (360) and the wall section (320') or between the sealing member (360) and the passivation layer (230').

On the other hand, although not shown, the electrode pads (330) extend to the other surface of the body section (310') of the package substrate (300') after passing through an interface between the body section (310') and the wall section (320') of the package substrate (300') instead of passing through the body section (310') of the package substrate (300'). That is, the electrode pads (330) may be formed in a '⊏'-shape, which extends from one surface of the body section (310') of the package substrate (300') to the other surface of the body section (310') through the interface between the body section (310') and the wall section (320') and a lateral side of the body section (310'). Here, the '⊏'-shaped electrode pads (330) may also be applied to other embodiments described with reference to FIG. 2 and FIG. 4.

Further, in this embodiment, the electrode pads (330) have a smaller thickness than the height of the wall section (320'). However, it should be noted that the electrode pads (330) may have the same height as that of the wall section (320'). That is, the height of the electrode pads (330) from the surface of the body section (310') may be the same as that of the wall section (320'). The height of the electrode pads (330) may also be applied to the other embodiments described with reference to FIG. 2 and FIG. 4.

Figure 4:
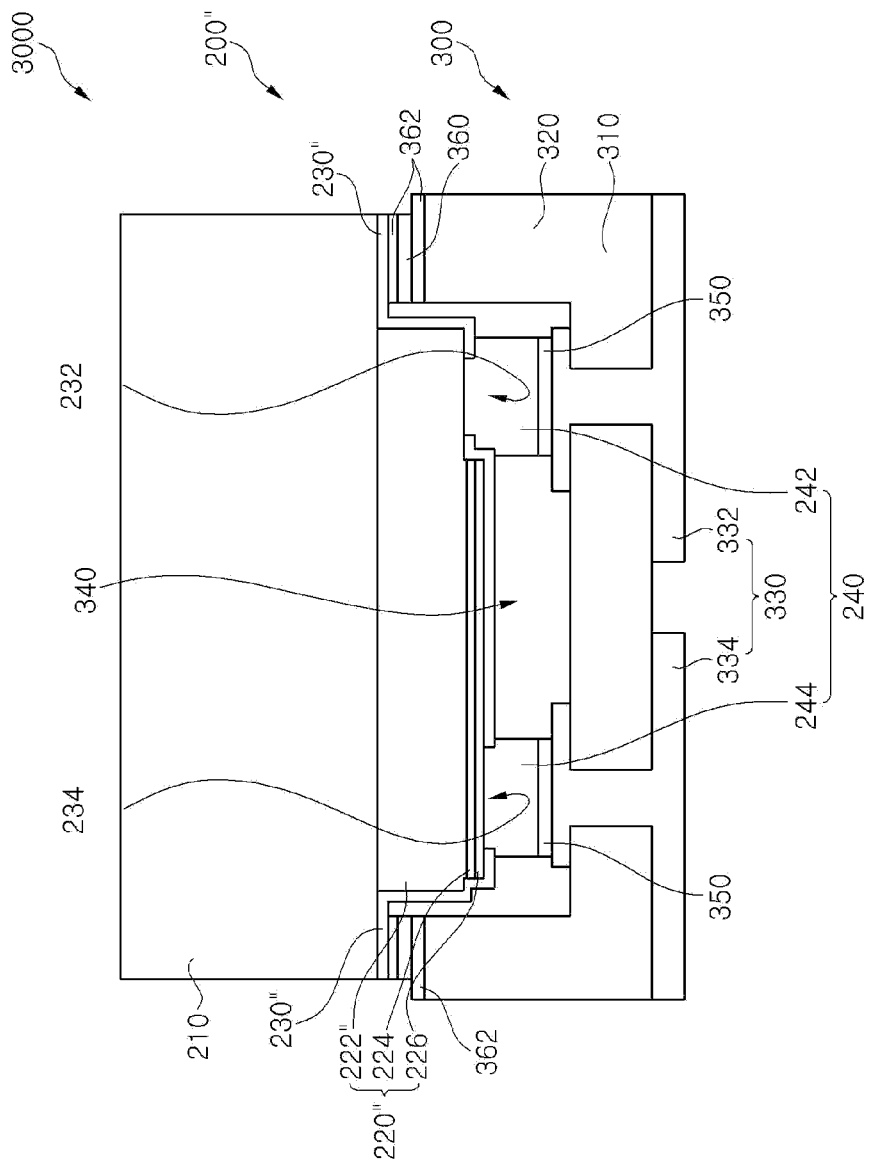
FIG. 4 is a sectional view of a light emitting diode package according to a further embodiment of the present invention.

FIG. 4 is a sectional view of a light emitting diode package according to a further embodiment of the present invention.

Referring to FIG. 4, a light emitting diode package (3000) according to this embodiment may comprise a light emitting diode chip (200") and a package substrate (300).

The light emitting diode chip (200") may comprise a growth substrate (210), a semiconductor structure layer (220"), a passivation layer (230"), and bumps (240).

The package substrate (300) may comprise a body section (310) and a wall section (320).

The body section (310) may comprise electrode pads (330).

Herein, since the light emitting diode package (3000) according to this embodiment is substantially the same as the light emitting diode package (1000) described with reference to FIG. 2 except for some features, the different features of the light emitting diode package (2000) will be mainly described hereinafter.

In the light emitting diode package (3000) according to this embodiment, part of the semiconductor structure layer (220"), for example, a buffer layer (not shown) or a first type semiconductor layer (222") may have a higher thickness than the buffer layer (not shown) or the first type semiconductor layer (222) of the light emitting diode package (1000) according to the above embodiment.

In addition, the passivation layer (230") may cover one surface of the growth substrate (210) or a lateral side of the semiconductor structure layer (220"), in which the passivation layer (230") covering the one surface of the growth substrate (210) may be thinner than the semiconductor structure layer (220"). Here, although the passivation layer (230") is illustrated as covering the one surface of the growth substrate (210) and the lateral side of the semiconductor structure layer (220"), it should be understood that the passivation layer (230") may cover only the one surface of the growth substrate (210) without covering the lateral side of the semiconductor structure layer (220").

Unlike the light emitting diode package (1000), in the light emitting diode package (3000) according to this embodiment, since an active layer (224) formed on the first type semiconductor layer (222") is disposed in a trench (340) of the package substrate (300), not only the passivation layer (230") but also the wall section (320) is disposed in the lateral direction of the active layer (224).

Although some embodiments have been described above, it should be understood that the present invention is not limited to these embodiments, and various modifications, changes, and alterations can be made without departing from the spirit and scope of the invention.

The invention claimed is:

1. A light emitting diode package comprising:
   a growth substrate;
   a passivation layer disposed on one surface of the growth substrate; and
   a package substrate comprising a body section and a wall section disposed on the body section, the wall section comprising a first end extending from the body section and a second end connected to the passivation layer,
   wherein at least a space between the body section, the wall section and the passivation layer is sealed from outside, and
   wherein the body section of the package substrate is integrally formed with the wall section thereof.

2. The light emitting diode package of claim 1, further comprising:
   a semiconductor structure layer arranged between the growth substrate and the passivation layer, the semiconductor structure layer comprising a first type semiconductor layer, an active layer and a second type semiconductor layer,
   wherein the passivation layer comprises openings through which the first type semiconductor layer and the second type semiconductor layer are partially exposed.

3. The light emitting diode package of claim 2, further comprising:
   a first bump and a second bump disposed on the passivation layer and electrically connected to the first type semiconductor layer and the second type semiconductor layer through the openings of the passivation layer, respectively.

4. The light emitting diode package of claim 3, wherein the first bump and the second bump are disposed in a predetermined area of the body section and brought into contact with a first electrode pad and a second electrode pad passing through the body section, respectively.

5. The light emitting diode package of claim 4, wherein contact between the first and second bumps and the first and second electrode pads is achieved via a conductive material.

6. The light emitting diode package of claim 2, wherein the passivation layer covers one surface and a lateral side of the semiconductor structure layer, or covers the one surface of the semiconductor structure layer without covering the lateral side thereof.

7. The light emitting diode package of claim 2, wherein the active layer is disposed such that the wall section of the package substrate is disposed in a lateral direction thereof.

8. The light emitting diode package of claim 1, wherein the passivation layer is connected to the wall section by a sealing member.

9. The light emitting diode package of claim 8, wherein the sealing member is a conductive material.

10. The light emitting diode package of claim 8, further comprising:
    a sealing pad between the passivation layer and the sealing member or between the sealing member and the wall section.

11. The light emitting diode package of claim 1, wherein the growth substrate comprises protrusions and grooves formed on a surface opposite the one surface.

12. A light emitting diode package comprising:
    a growth substrate;
    a passivation layer disposed on one surface of the growth substrate; and
    a package substrate comprising:
      a body section, and
      a wall section disposed on the body section and extending from the body section at a first end and connecting to the passivation layer at a second end,
    wherein at least a space between the body section, the wall section and the passivation layer is sealed from outside, and
    wherein the body section and the wall section of the package substrate comprise different materials.

13. The light emitting diode package of claim 12, further comprising:
    a semiconductor structure layer arranged between the growth substrate and the passivation layer, the semiconductor structure layer comprising a first type semiconductor layer, an active layer and a second type semiconductor layer,
    wherein the passivation layer comprises openings through which the first type semiconductor layer and the second type semiconductor layer are partially exposed.

14. The light emitting diode package of claim 13, further comprising:
    a first bump and a second bump disposed on the passivation layer and electrically connected to the first type semiconductor layer and the second type semiconductor layer through the openings of the passivation layer, respectively.

15. The light emitting diode package of claim 14, wherein the first bump and the second bump are disposed in a predetermined area of the body section and brought into contact with a first electrode pad and a second electrode pad passing through the body section, respectively, and
    contact between the first and second bumps and the first and second electrode pads is achieved via a conductive material.

16. The light emitting diode package of claim 13, wherein the passivation layer covers one surface and a lateral side of the semiconductor structure layer, or covers the one surface of the semiconductor structure layer without covering the lateral side thereof.

17. The light emitting diode package of claim 13, wherein the active layer is disposed such that the wall section of the package substrate is disposed in a lateral direction thereof.

18. The light emitting diode package of claim 12, wherein the passivation layer is connected to the wall section by a sealing member.

19. The light emitting diode package of claim 18, wherein the sealing member is a conductive material.

20. The light emitting diode package of claim 18, further comprising:
    a sealing pad between the passivation layer and the sealing member or between the sealing member and the wall section.

* * * * *